United States Patent
Torres Robles (12)

(10) Patent No.: US 11,687,066 B2
(45) Date of Patent: Jun. 27, 2023

(54) VIRTUAL CROSS METROLOGY-BASED MODELING OF SEMICONDUCTOR FABRICATION PROCESSES

(71) Applicant: Siemens Industry Software Inc., Plano, TX (US)

(72) Inventor: Juan Andres Torres Robles, Wilsonville, OR (US)

(73) Assignee: Siemens Industry Software Inc., Plano, TX (US)

(*) Notice: Subject to any disclaimer, the term of this patent is extended or adjusted under 35 U.S.C. 154(b) by 31 days.

(21) Appl. No.: 17/462,675

(22) Filed: Aug. 31, 2021

(65) Prior Publication Data
US 2023/0066516 A1    Mar. 2, 2023

(51) Int. Cl.
G05B 19/418     (2006.01)
G03F 7/20        (2006.01)
G03F 7/00        (2006.01)

(52) U.S. Cl.
CPC ....... G05B 19/41885 (2013.01); G03F 7/705 (2013.01); *G05B 2219/45028* (2013.01); *G05B 2219/45031* (2013.01)

(58) Field of Classification Search
CPC .... G05B 19/41885; G05B 2219/45028; G05B 2219/45031; G03F 7/705
See application file for complete search history.

(56) References Cited

U.S. PATENT DOCUMENTS

| | | | | |
|---|---|---|---|---|
| 2007/0100487 A1* | 5/2007 | Cheng | ............... | G05B 19/41875 700/51 |
| 2008/0275586 A1* | 11/2008 | Ko | ..................... | G05B 23/0221 700/109 |
| 2010/0312374 A1* | 12/2010 | Tsai | ........................ | H01L 22/12 700/121 |
| 2011/0190917 A1* | 8/2011 | Moyne | .................... | G16Z 99/00 700/103 |
| 2014/0031969 A1* | 1/2014 | Baseman | ............. | G05B 13/048 700/121 |
| 2014/0282324 A1* | 9/2014 | Greiner | ................... | G06F 30/39 716/111 |
| 2022/0026861 A1* | 1/2022 | Cheng | ............... | G05B 19/41875 |

\* cited by examiner

*Primary Examiner* — Ronald D Hartman, Jr.

(57) ABSTRACT

A computing system may include a virtual cross metrology engine configured to construct a given virtual metrology model. The given virtual metrology model may take, as inputs, process parameters applied for the given step of a semiconductor fabrication process. The virtual cross metrology engine may also be configured to construct a subsequent virtual metrology model, and the subsequent step is performed after the given step in the semiconductor fabrication process. Doing so may include determining inputs for the subsequent virtual metrology model from a combination of the process parameters applied for the given step of the semiconductor fabrication process, process parameters applied for the subsequent step of the semiconductor fabrication process, and a wafer value for the given step of the semiconductor fabrication process that the given virtual metrology model is configured to predict.

14 Claims, 6 Drawing Sheets

VIRTUAL CROSS METROLOGY-BASED MODELING OF SEMICONDUCTOR FABRICATION PROCESSES

BACKGROUND

Electronic circuits, such as integrated circuits, are used in nearly every facet of modern society, from automobiles to microwaves to personal computers. Design of circuits may involve many steps, known as a "design flow." The particular steps of a design flow are often dependent upon the type of microcircuit being designed, its complexity, the design team, and the circuit fabricator or foundry that will manufacture the circuit. Electronic design automation (EDA) applications support the design and verification of circuits prior to fabrication. EDA applications may implement various EDA procedures, e.g., functions, tools, or features to analyze, test, or verify a circuit design at various stages of the design flow.

BRIEF DESCRIPTION OF THE DRAWINGS

Certain examples are described in the following detailed description and in reference to the drawings.

DETAILED DESCRIPTION

Figure 1:
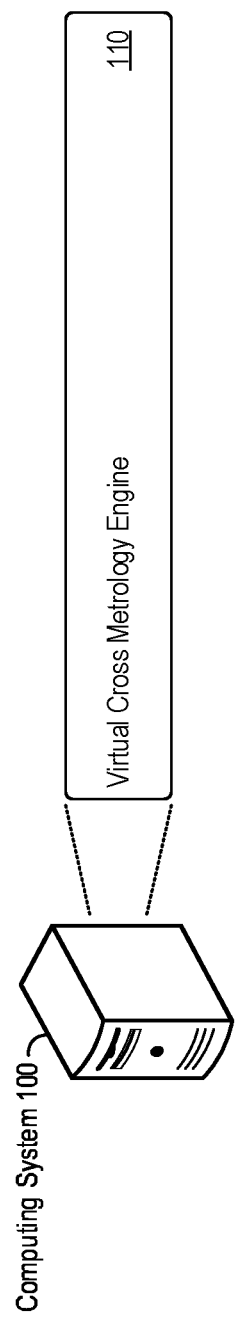
FIG. 1 shows an example of a computing system that supports virtual cross metrology-based modeling of semiconductor fabrication processes.

Modern circuit designs continue to increase in complexity, and transistor counts numbering in the billions, tens of billions, and more can occur in modern IC designs. With such design complexity, appropriate analysis and verification of circuit designs may be necessary to ensure that IC reliability, functionality, and performance requirements are satisfied. Semiconductor fabrication processes can be incredibly complex, requiring performance of tens to hundreds of sequential process steps in order to manufacture ICs from wafer substrates. Monitoring wafer states during fabrication to ensure proper IC manufacture can be challenging. Physically conducting wafer measurements during a semiconductor fabrication process will necessarily lower manufacturing efficiency and circuit yields, especially as some physical measurements can be destructive in nature. Moreover, comprehensively measuring entire wafer lots across up to hundreds of different process steps may require days or weeks to completely manufacture a given circuit design, if complete manufacture is even possible. Such costly efforts to obtain physical metrology values through conducting physical measurements during circuit fabrication may be impractical or near-impossible in present circuit manufacturing contexts.

Virtual metrology may provide a mechanism to predict wafer characteristics without physical measurement. With continuing increases in modern computing capabilities, it has become increasingly feasible to model aspects of semiconductor fabrication processes via machine learning and complex modeling techniques. In some implementations, virtual metrology can predict any number of wafer values for a given process step based on process, environment, or production data. Machine learning models can be trained with training data for a specific step in a semiconductor fabrication process, and training data may comprise any number of input process parameters, equipment data, production states, environment characteristics, input wafer characteristics, or metrology values measured prior to performing the specific step in the semiconductor fabrication process. In the training data of such machine learning models, such input data may be correlated to physical wafer values sampled from measurements sites of a wafer after performing specific steps during a semiconductor fabrication process. Through such training data, machine learning models may learn correlations between the input data values and target wafer values that the machine learning model is then configured to predict as virtual metrology values.

While such virtual metrology techniques may provide capabilities to predict wafer characteristics fora particular step in semiconductor fabrication processes, such models can be limited in scope. Limited number of physical samples may bound the amount of training data that a machine learning model can consume. Moreover, many behaviors of process steps in semiconductor fabrication processes can be design dependent, often exhibiting different process behaviors (and thus affecting wafers differently) based on the specific circuit design being manufactured. Such singe-step machine learning models can only account for specific input process parameters, equipment data, and environment conditions specific to that single-step in a semiconductor fabrication process. As such, no consideration is given to if or how prior process steps in the semiconductor fabrication process may impact a particular process step (and thus the wafer characteristics produced by performing the particular process step). Accordingly, conventional virtual metrology techniques for generation of predictive machine learning models may be limited to a single process step, resulting in incomplete or inaccurate predictive capabilities.

The disclosure herein may provide systems, methods, devices, and logic for virtual cross metrology-based modeling of semiconductor fabrication processes. Virtual cross metrology may refer the use of data collected across multiple different process steps of a semiconductor fabrication process in predicting a metrology value for a given process step in the semiconductor fabrication process. As described in greater detail herein, the virtual cross metrology technology of the present disclosure may support construction of machine learning models (also referred to herein as virtual metrology models) that account for multiple different process steps in a semiconductor fabrication process. Instead of isolating a given process step in the semiconductor fabrication process for which to generate a virtual metrology model using only the process parameters and input wafer characteristics of the given process step (as may be the case in conventional virtual metrology technologies), virtual metrology models according to the present disclosure can be trained with data characterizing or quantifying previous steps in the semiconductor fabrication process, including process parameters, design content, and metrology values (e.g., wafer characteristics) for the previous steps.

As such, the virtual cross metrology technology of the present disclosure may provide a coherent framework in which multiple sources of metrology, process, and design can be combined into a given virtual metrology model, which can improve the quality and accuracy of predicted wafer characteristics determined by such virtual metrology models. Seemingly unrelated metrology values (e.g., measurements or predicted wafer characteristics) across multiple process steps may be learned by the virtual metrology models of the present disclosure and applied for a given process step. Doing so may increase the accuracy at which virtual metrology models predict wafer characteristics for the given process step.

Various aspects of virtual cross metrology technology and quantified technical improvements of the present disclosure are described in Stefan Schueler et al., "Virtual metrology: how to build the bridge between the different data sources", Proc. SPIE 11611, Metrology, Inspection, and Process Control for Semiconductor Manufacturing) XXXV, 116112D (22 Feb. 2021); https://doi.org/10.1117/12.2588467 (hereinafter, the "SPIE Virtual Metrology paper"), the contents of which are incorporated herein by reference in their entirety. The subject matter of the SPIE Virtual Metrology paper was publicly disclosed by and is the own work of inventor Juan Andres Torres Robles of the present disclosure. Some experimental results as described in the SPIE Virtual Metrology paper indicate that the described virtual cross metrology technology of the present disclosure can improve the accuracy of virtual metrology determinations (e.g., wafer characteristic predictions) through a 37% reduction in the root mean square error (RMSE) as compared to conventional single-process step models. As another technical benefit, the virtual cross metrology techniques of the present disclosure can support the creation of increasingly complete wafer maps to model lithographical fabrication processes, as also detailed in the SPIE Virtual Metrology paper. Accordingly, the virtual cross metrology technology of the present disclosure can provide a unified framework to predict metrology values in circuit fabrications with increased accuracy and reliability.

These and other aspects of virtual cross metrology technology according to the present disclosure and the technical benefits of such virtual cross metrology technology are described in greater detail herein.

FIG. 1 shows an example of a computing system 100 that supports virtual cross metrology-based modeling of semiconductor fabrication processes. The computing system 100 may take the form of a single or multiple computing devices such as application servers, compute nodes, desktop or laptop computers, smart phones or other mobile devices, tablet devices, embedded controllers, and more. In some implementations, the computing system 100 hosts, instantiates, executes, supports, or implements an EDA application that supports circuit design and analysis, and may accordingly provide or implement any of the virtual cross metrology technology described herein.

As an example implementation to support any combination of the virtual cross metrology technology described herein, the computing system 100 shown in FIG. 1 includes a virtual cross metrology engine 110. The computing system 100 may implement the virtual cross metrology engine 110 (including components thereof) in various ways, for example as hardware and programming. The programming for the virtual cross metrology engine 110 may take the form of processor-executable instructions stored on a non-transitory machine-readable storage medium and the hardware for the virtual cross metrology engine 110 may include a processor to execute those instructions. A processor may take the form of single processor or multi-processor systems, and in some examples, the computing system 100 implements multiple engines using the same computing system features or hardware components (e.g., a common processor or a common storage medium).

In operation, the virtual cross metrology engine 110 may construct a given virtual metrology model configured to predict a wafer value for a given step of a semiconductor fabrication process, and the given virtual metrology model may take, as inputs, process parameters applied for the given step of the semiconductor fabrication process. The virtual cross metrology engine 110 may further construct a subsequent virtual metrology model configured to predict a wafer value for a subsequent step of the semiconductor fabrication process, and the subsequent step may be performed after the given step in the semiconductor fabrication process. The virtual cross metrology engine 110 may construct the subsequent virtual metrology model by determining inputs for the subsequent virtual metrology model from a combination of the process parameters applied for the given step of the semiconductor fabrication process, process parameters applied for the subsequent step of the semiconductor fabrication process, and the wafer value for the given step of the semiconductor fabrication process that the given virtual metrology model is configured to predict.

These and other aspects of virtual cross metrology technology according to the present disclosure are described in greater detail next.

Figure 2:
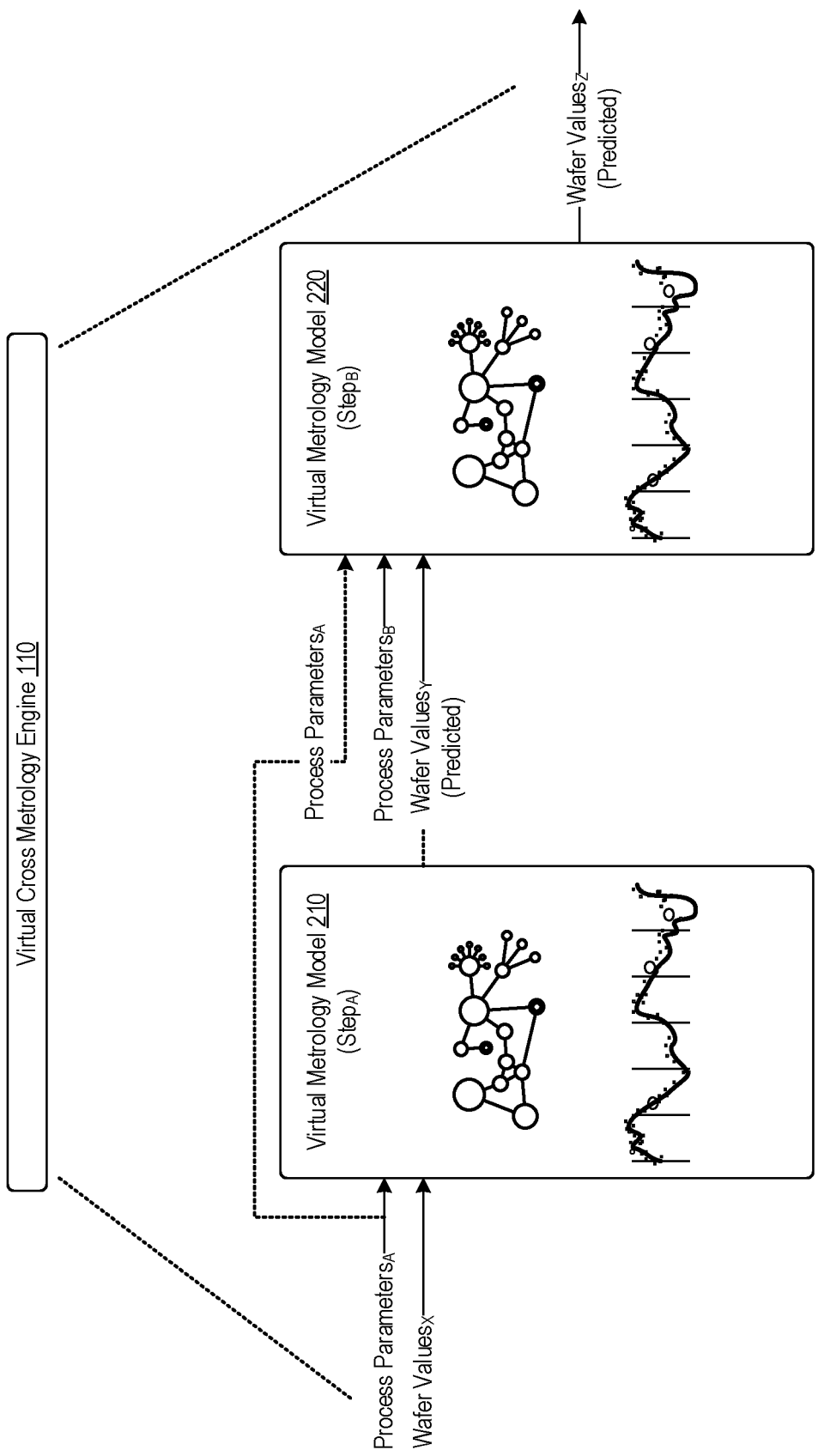
FIG. 2 shows an example construction of multiple virtual metrology models according to the present disclosure.

FIG. 2 shows an example construction of multiple virtual metrology models according to the present disclosure. In the example of FIG. 2, the virtual cross metrology engine 110 may construct virtual metrology models using any number of the various virtual cross metrology features described herein, and may do so to model different process steps of a semiconductor fabrication process. As noted herein, semiconductor fabrication processes may be incredibly complex, and may require tens or hundreds of steps performed sequentially to progressively process a silicon wafer or other suitable substrate as required to manufacture a particular circuit design. The virtual cross metrology engine 110 may model given steps in the semiconductor fabrication process and, in doing so, account for process parameters, inline metrology values, or other characteristics of previous steps in the semiconductor fabrication process.

To provide an illustrative example through FIG. 2, the virtual cross metrology engine 110 may construct virtual metrology models for two steps of a semiconductor fabrication process, denoted in FIG. 2 as $step_A$ and $step_B$. $step_B$ may be directly subsequent to $step_A$ in the semiconductor fabrication process in that $step_B$ is the next step in the semiconductor fabrication process performed after $step_A$. In the particular example of FIG. 2, $step_A$ may be an initial step in the semiconductor fabrication process. In that regard, $step_A$ may be the first step in the semiconductor fabrication process performed on wafer substrate and $step_B$ may be the second step performed in the semiconductor fabrication process.

The virtual cross metrology engine 110 may construct a virtual metrology model for $step_A$ of the semiconductor fabrication process, shown in FIG. 2 as the virtual metrology model 210. The virtual metrology model 210 constructed by the virtual cross metrology engine 110 may predict a wafer characteristic applicable to $step_A$ of the semiconductor fabrication process. The predicted wafer characteristic may specify a quantitative value for the wafer that results from (or occurs during) performance of $step_A$ in the semiconductor fabrication process. In that regard, the virtual metrology model 210 may provide any suitable virtual metrology capabilities to predict wafer characteristics, e.g., via machine learning, and doing so as a function of inputs comprising process parameters, equipment data, production states, input wafer characteristics, or other suitable input data applicable to characterize step$_A$ of the semiconductor fabrication process in any way.

The wafer characteristic(s) that the virtual metrology model 210 is configured to predict may be configurable, and may thus be set by the virtual cross metrology engine 110 to be any wafer characteristic applicable to, representative of, or related to step$_A$ of the semiconductor fabrication process. As one example, step$_A$ may be an epitaxy step performed in the semiconductor fabrication process, and the virtual cross metrology engine 110 may construct the virtual metrology model 210 to predict a wafer thickness after performing the epitaxy step in the semiconductor fabrication process. Such a predicted wafer thickness and any other wafer characteristic predicted by virtual metrology models of the present disclosure may be referred to as a wafer value. Accordingly, wafer values determined by the virtual metrology model 210 may be specific metrology values (e.g., quantitative values) for a specific type of wafer characteristic that a given virtual metrology model is configured to predict.

Returning to the example of FIG. 2, the virtual metrology model 210 may take the form of any suitable machine learning model that can generate predicted wafer values. For instance, the virtual cross metrology engine 110 may construct the virtual metrology model 210 by training a machine learning model with training data, and the trained machine learning model may then be the constructed virtual metrology model 210. Any suitable machine learning capability, algorithm, or technique may be implemented or applied to construct the virtual metrology model 210, including any type of unsupervised, supervised, semi-supervised machine learning models. Neural networks, reinforced learning models, or any other suitable machine learning implementations are contemplated herein, and the virtual cross metrology engine 110 may construct the virtual metrology model 210 accordingly.

To construct the virtual metrology model 210, the virtual cross metrology engine 110 may generate training data specific to step$_A$ of the semiconductor fabrication process. In some implementations, the virtual cross metrology engine 110 may access generate or obtain training data samples which include input wafer characteristics, in-line production data (e.g., production states), equipment data, environment parameters, or any other form of input data that characterizes step$_A$, which can then be paired to a corresponding wafer value measured from a physically manufactured circuit. Using the epitaxy process step as an example, input process parameters of training data may include quantitative values for gas flow, chamber temperature, pressure, equipment types, wafer locations, equipment power measurements, time since last equipment maintenance, chamber numbers, processing times, and many more. The number of input parameters for training the virtual cross metrology engine 110 may be immense and configurable, particularly as any quantitative data that characterizes the epitaxy process, epitaxy equipment used, production states during performance of the epitaxy process, or fabrication environment in which the epitaxy process is performed can be a suitable input parameter for the training data. As part of the training data, each sample may pair input process parameters values (and/or other characterizations of the epitaxy process step) to a physical metrology sampled or otherwise measured from wafers on which the epitaxy process step is performed.

In some implementations, the virtual cross metrology engine 110 may account for circuit design content. The specific circuit design that is being manufactured through a semiconductor fabrication process may impact the performance of the various process steps of the semiconductor fabrication process. To more accurately model different steps in the semiconductor fabrication process and to learn and account for relationships between input parameters of different process steps, the virtual cross metrology engine 110 may account for design content in construction of virtual metrology models. As such, design values to encapsulate or otherwise represent circuit designs may be included in the training data used to construct virtual metrology models according to the present disclosure. The virtual cross metrology engine 110 may encode design data through any suitable processing and encoding scheme to represent circuit design data in a quantitative or encoded form. The virtual metrology model 210 may be constructed to predict a wafer value (e.g., wafer thickness) based on input process parameters and design content applicable to step$_A$ of the semiconductor fabrication process that the virtual cross metrology engine 110 is configured to model and predict wafer values for.

In the example of FIG. 2, the virtual cross metrology engine 110 constructs the virtual metrology model 210 to model step$_A$ of the semiconductor fabrication process. In the examples shown in FIG. 2, the virtual metrology model 210 may be configured to take, as inputs, process parameters used to perform step$_A$ and wafer characteristics of input wafers, shown as wafer values$_X$ in FIG. 2. The virtual metrology model 210 may, however, take any additional or alternative inputs suitable to predict wafer characteristics as a result of performing step$_A$ of the semiconductor fabrication process. As also seen in FIG. 2, the virtual metrology model 210 may be configured to generate predicted wafer characteristics as a result of (or in the course of) performing step$_A$, shown in FIG. 2 as the wafer values$_Y$.

As step$_A$ may be an initial step in a semiconductor fabrication process, the virtual cross metrology engine 110 may construct the virtual metrology model 210 as model for a single process step, as no preceding steps in the semiconductor fabrication process need be (or can be) accounted for in modeling step$_A$. However, virtual metrology models constructed for subsequent steps in the semiconductor fabrication process may account for step$_A$ in the semiconductor fabrication process, and may thus employ virtual cross metrology technology to increase model accuracy.

As an illustrative example in FIG. 2, the virtual cross metrology engine 110 may construct a virtual metrology model for step$_B$ of the semiconductor fabrication process, shown in FIG. 2 as the virtual metrology model 220. The virtual metrology model 220 for step$_B$ of the semiconductor fabrication process may be generated to predict wafer characteristics resultant from performing step$_B$ in the semiconductor fabrication process. As such, the virtual cross metrology engine 110 may construct the virtual metrology model 220 to account for process parameters, equipment data, in-line production data, environment parameters, or any other suitable input data to characterize step$_B$ of the semiconductor fabrication process. However, the virtual cross metrology engine 110 need not construct the virtual metrology model 220 solely based on direct characterizations of step$_B$, and may further construct the virtual metrology model 220 to account for aspects or characterizations of any number of previous steps in the semiconductor fabrication process as well, such as step$_A$.

In doing to, the virtual cross metrology engine 110 may construct the virtual metrology model 220 for $step_B$ by combining or accounting for seemingly incompatible process parameters, metrology measurements, and other aspects of $step_A$ in the semiconductor fabrication process, doing so to increase the coverage and capability of the virtual metrology model 220 for $step_B$ of the semiconductor fabrication process. To account for multiple and different steps in the semiconductor fabrication process, the virtual cross metrology engine 110 may generate training data that includes process step characterizations or predicted wafer characteristic outputs from the multiple different steps of the semiconductor fabrication process. Thus, the virtual cross metrology engine 110 may train the virtual metrology model 220 using input parameters (e.g., process parameters and other process characterizations) for both $step_A$ and $step_B$ of the semiconductor fabrication process and input wafer characteristics for performing $step_B$, which may be virtual metrology values predicted by the virtual metrology model 210, physically measured values, or a combination of both.

The virtual cross metrology engine 110 may thus construct the virtual metrology model 220 to predict wafer values resultant from (or in the course of) performing $step_B$ of the semiconductor fabrication process. Note that the wafer values predicted by a given virtual metrology model constructed to model a given step in the semiconductor fabrication process may be specific to the given step. As an illustrative example, $step_B$ of the semiconductor fabrication process may be a lithography step in the semiconductor fabrication process, and the virtual metrology model 220 may predict wafer values in the form of critical dimension values, line roughness values, and the like. Such predicted wafer characteristics may be different from the wafer values predicted by other virtual metrology models constructed by the virtual cross metrology engine 110 for other steps in the semiconductor fabrication process. In a similar manner, input process parameters, equipment data, in-line production data, and environment parameters applicable may be specific and unique for each different virtual metrology model constructed to model different steps in the semiconductor fabrication process.

In the example of FIG. 2, the virtual metrology model 220 is configured to predict wafer values specific to $step_B$ of the semiconductor fabrication process, shown in FIG. 2 as wafer $values_Z$. The virtual metrology model 220 may be configured to do so based on inputs of the process parameters applied for $step_B$ of the semiconductor fabrication process, the process parameters applied for $step_A$ of semiconductor fabrication process (which may be unique to and different from the process parameters applied for $step_B$ of the semiconductor fabrication process), and in-line metrology values (e.g., wafer values) for $step_A$ of the semiconductor fabrication process that the virtual metrology model 210 constructed for $step_A$ is configured to predict. In a consistent manner, virtual metrology models constructed for subsequent steps in the semiconductor fabrication process may account for process parameters, equipment data, in-line production data, environment parameters, predicted or measured metrology values, etc. of $step_A$, $step_B$, and any other preceding step in the semiconductor fabrication process.

Accordingly, the virtual cross metrology technology of the present disclosure may support training of virtual metrology models for given steps in a semiconductor fabrication process using predicted metrology values and process parameters of any number of preceding steps in the semiconductor fabrication process. Trained and constructed virtual metrology models for the given step may thus predict wafer values for the given step accounting for process parameters, equipment data, in-line production data, environment parameters, and/or any suitable characterization of, not only the given step, but also some (e.g., all) of the preceding steps in the semiconductor fabrication process and further including predicted metrology values for the preceding steps. By extending the scope of input data by which the virtual metrology models of the present disclosure learn from and account for in generating predicted wafer values, the virtual cross metrology technology of the present disclosure may increase the accuracy and reliability of virtual metrology predictions, reducing statistical error and increasing model accuracies.

While one example is shown in FIG. 2 through virtual metrology models for $step_A$ and $step_B$, virtual cross metrology-based training and construction of virtual metrology models may be consistently implemented for successive steps in the semiconductor process. However, as the number of previous steps accounted for in construction of a given virtual metrology model for a given step in the semiconductor fabrication process increase, the number of input parameters to the given virtual metrology model can increase as well. Such an increase in parameters can be, at times, exponential in nature, especially if all of the process parameters and predicted wafer values for every preceding step in the semiconductor fabrication process are accounted for. It is possible to train a virtual metrology model with up to hundreds or thousands of input parameters (or more) that can account for hundreds of previous process steps.

Accounting for so many input parameters in constructed virtual metrology models can be unwieldy. In some implementations, the virtual cross metrology engine 110 may select a subset of the process step characterizations and metrology values applied for a given step and preceding steps of the semiconductor fabrication process for which to configure as inputs to a virtual metrology model constructed for the given step. Example features of such selection are described in greater detail next with reference to FIG. 3.

Figure 3:
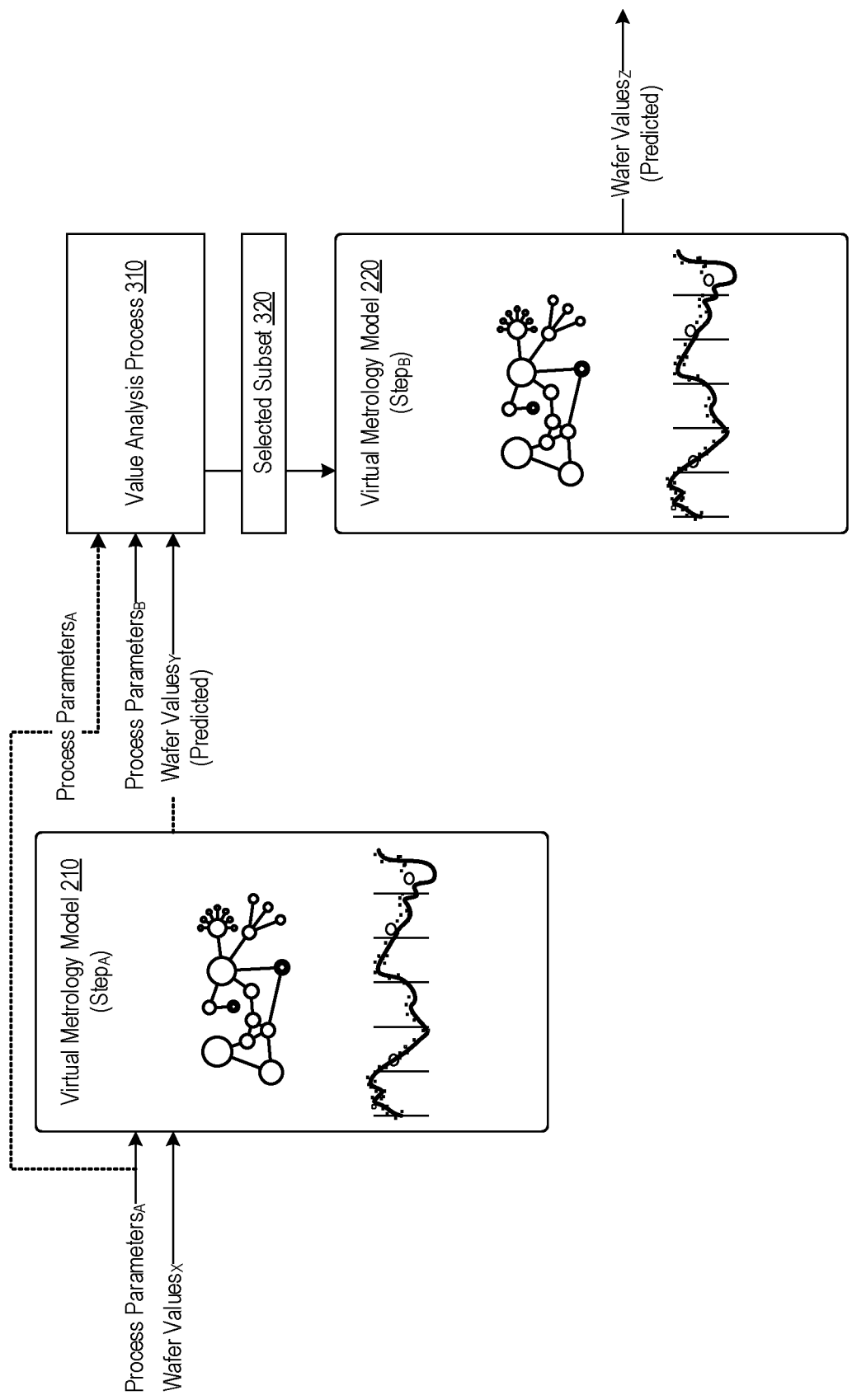
FIG. 3 shows an example input determination for construction of a virtual metrology model according to the present disclosure.

FIG. 3 shows an example input determination for construction of a virtual metrology model according to the present disclosure. In the example of FIG. 3, the virtual cross metrology engine 110 determines inputs for the virtual metrology model 220 constructed to model $step_B$ of a semiconductor fabrication process.

As noted herein, virtual cross metrology technology may account for process characterizations and metrology values from preceding steps in the semiconductor fabrication process. As such, the virtual cross metrology engine 110 may construct the virtual metrology model 220 to account for the process parameters applied for $step_B$ of the semiconductor fabrication process (shown as process $parameters_A$ in FIG. 3), the process parameters applied for $step_A$ of semiconductor fabrication process (shown as process $parameters_A$ in FIG. 3), and the wafer value for the $step_A$ of the semiconductor fabrication process that the virtual metrology model 210 is configured to predict (shown as the wafer $values_Y$ in FIG. 3). In constructing the virtual metrology model 220, the virtual cross metrology engine 110 may determine the inputs for the virtual metrology model 220 by determining a selected subset of process $parameters_A$, process $parameters_B$, and wafer $values_Y$ to set as the inputs for the virtual metrology model 220. To determine the selected subset, the virtual cross metrology engine 110 may perform a value analysis process 310 on the process parameters applied for $step_A$ of the semiconductor fabrication process, the process parameters applied for $step_B$ of semiconductor fabrication process, and the wafer values for $step_A$ of the semiconductor fabrication process that the virtual metrology model 210 is configured to predict.

Though the value analysis process 310, the virtual cross metrology engine 110 may determine impact contributions to the wafer values$_Z$ predicted by the virtual metrology model 220 for $step_B$ of the semiconductor fabrication process. The virtual cross metrology engine 110 may then determine the selected subset (for inputs to the virtual metrology model 220) based on the impact contributions determined through the value analysis process 310. In some implementations, the value analysis process 310 performed or implemented by the virtual cross metrology engine 110 includes a Shapley value analysis (also referred to as Shapley analysis).

In performing the value analysis process 310, the virtual cross metrology engine 110 may analyze an over-fitted model, such as the virtual metrology model 220 that takes all of the process parameters$_A$, process parameters$_B$, and wafer values$_Y$, as inputs. Through the value analysis process 310, the virtual cross metrology engine 110 may identify the impact of each individual input parameter on the output prediction determined by the virtual metrology model 220— in this case, the wafer values$_Z$. The virtual cross metrology engine 110 may determine a selected subset from the process parameters$_A$, process parameters$_B$, and wafer values$_Y$ by removing any parameters that have insignificant statistical impact on computing wafer values$_Z$ (e.g., lower than a threshold statistical impact or impact contribution measure as specified by the value analysis process 310).

In the example of FIG. 3, the virtual cross metrology engine 110 determines the selected subset 320 of parameters from among the process parameters$_A$, process parameters$_B$, and wafer values$_Y$ for which to set as inputs for the virtual metrology model 220 to predict wafer values for $step_B$ of the semiconductor fabrication process. Through such value analysis process and input parameter reduction, the virtual cross metrology technology of the present disclosure may increase the efficiency by which virtual metrology models predict wafer characteristics, but do so while continuing to account for process parameters and characterizations from previous steps of the semiconductor fabrication process. By rooting out statistically insignificant input parameters, the virtual cross metrology engine 110 may reduce resource consumption and improve execution latency for generation of predicted wafer characteristics via virtual metrology models.

Note that the virtual cross metrology engine 110 may evaluate input parameters and perform value analysis processes independently for each different step of a semiconductor fabrication process. Example features of such independent evaluation are described next with reference to FIG. 4.

Figure 4:
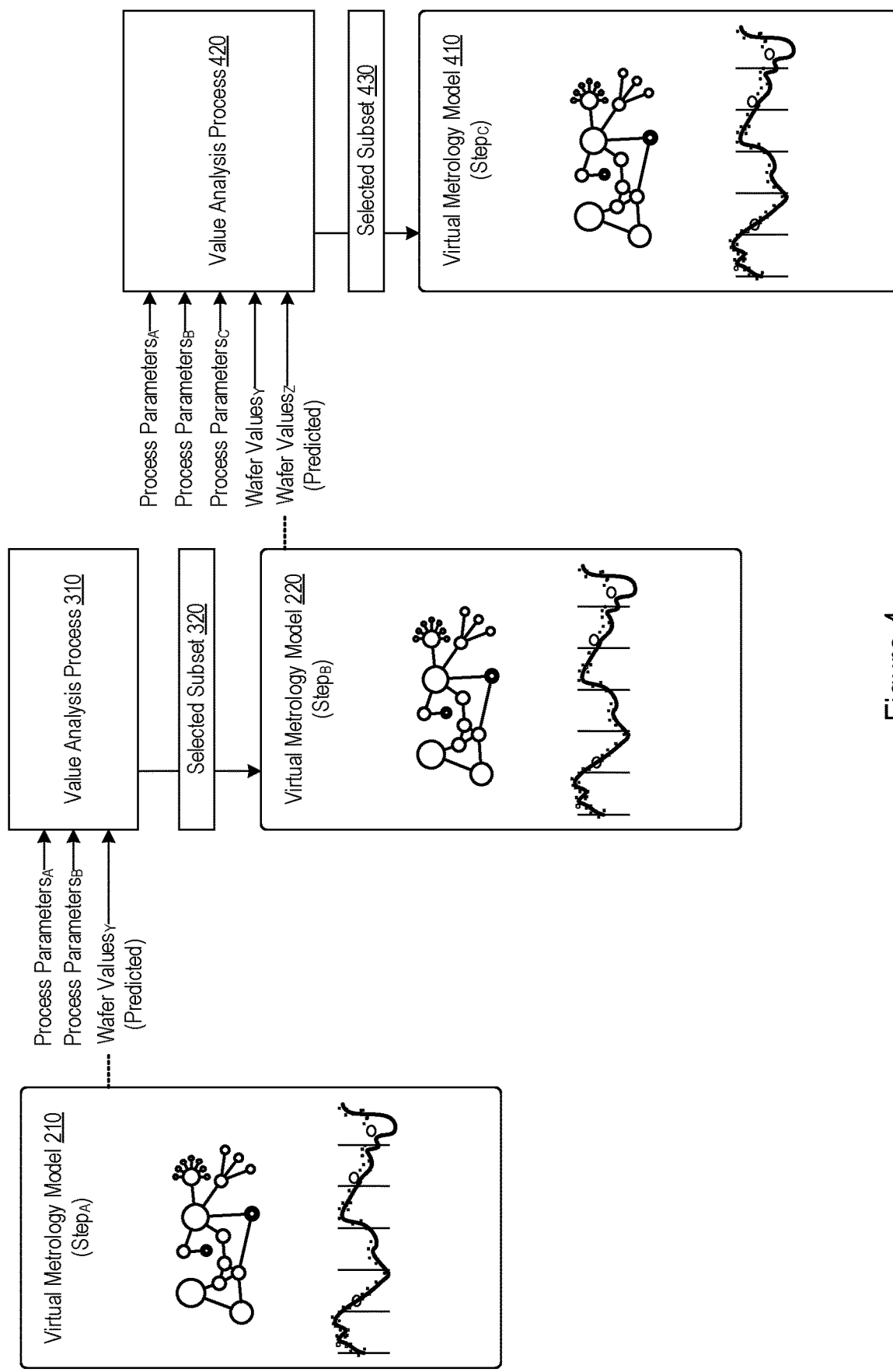
FIG. 4 shows an example of different input determinations for construction of different virtual metrology models according to the present disclosure.

FIG. 4 shows an example of different input determinations for construction of different virtual metrology models according to the present disclosure. In the example of FIG. 4, the virtual cross metrology engine 110 constructs the virtual metrology models 210 and 220 as described in FIGS. 2 and 3. In the example of FIG. 4, the virtual cross metrology engine 110 also constructs a virtual metrology model 410 for $step_C$ of the semiconductor fabrication process. Through the virtual cross metrology technology of the present disclosure, the virtual cross metrology engine 110 may model $step_C$ of the semiconductor fabrication process by accounting for the process parameters (and other suitable characterizations) of not only $step_C$ (shown as process parameters$_C$ in FIG. 4), but also the process parameters of $step_A$ and $step_B$ that precede $step_C$ in the semiconductor fabrication process (shown as process parameters$_A$ and process parameters$_B$ in FIG. 4). Construction of the virtual metrology model 410 for $step_C$ may further account for the metrology values predicted for $step_A$ and $step_B$ via the virtual metrology models 210 and 220 (shown as wafer values$_Y$ and wafer values$_Z$ in FIG. 4).

In constructing the virtual metrology model 220, the virtual cross metrology engine 110 may set inputs for the virtual metrology model 220 via performing a value analysis process 310 to determine a selected subset 320 of the process parameters$_A$, process parameters$_B$, and the wafer values$_Y$. However, in setting the inputs for the virtual metrology model 410, the virtual cross metrology engine 110 need not use the selected subset 320 determined for process parameters$_A$, process parameters$_B$, and wafer values$_Y$ even though process parameters$_A$, process parameters$_B$, and wafer values$_Y$ are also accounted for in construction of the virtual metrology model 410. This may be the case as different process parameters and metrology values may impact different processes in the semiconductor fabrication process differently. As such, the virtual cross metrology engine 110 may independently evaluate the universe of input parameters considered for each given virtual metrology model constructed for different steps in the semiconductor fabrication process.

In FIG. 4, the virtual cross metrology engine 110 performs independent value analysis processes in determining inputs for the virtual metrology models 220 and 410. The performed value analysis processes may be independent in that the results of a given value analysis process are not used or otherwise accounted for in another value analysis process. This may be the case even if the value analysis process techniques performed for each virtual metrology model are the same (e.g., both Shapley value analyses). Thus, the virtual cross metrology engine 110 may perform a value analysis process 420 for the input parameters accounted for in construction of the virtual metrology model 410, namely process parameters$_A$, process parameters$_B$, process parameters$_C$, wafer values$_Y$, and wafer values$_Z$, and do so without reference or reliance on the value analysis process 320 performed in construction of the virtual metrology model 220. The value analysis process 420 may include a Shapley value analysis (e.g., the same technique as the value analysis process 310 performed for the virtual metrology model 220). The virtual cross metrology engine 110 may perform the value analysis process 420 on an over-fitted model of the $step_C$ of the semiconductor fabrication process that takes, as inputs, all parameters among parameters$_A$, process parameters$_B$, process parameters$_C$, wafer values$_Y$, and wafer values$_Z$. Through the value analysis process 420, the virtual cross metrology engine 110 may determine the selected subset 430 of input parameters for which to configure the virtual metrology model 410 (e.g., by removing considered parameters with insignificant statistical contribution).

In any such manner as described herein, the virtual cross metrology engine 110 may determine inputs for different constructed virtual metrology models, doing so via value analysis processes performed independent from results or selected subsets determined for other virtual metrology models. Moreover, through such virtual metrology models constructed for sequential steps in the semiconductor fabrication process, metrology coverage for any desired wafer or wafer portion can be computed and modeled. Such increased wafer coverage may be especially beneficial for destructive inline measurements, as such physical measurements need not be performed to destroy partially manufactured circuit wafers (and thus necessarily decreasing production yields).

Through models that account for preceding steps, increased modeling accuracy can be achieved. Specific and tangible technical improvements in modeling accuracy are further described in the SPIE Virtual Metrology paper, and such results may represent example technical effects and benefits that virtual cross metrology technology can provide.

As described herein, the virtual cross metrology technology may support construction of virtual metrology models that can predict metrology values for different steps of a semiconductor fabrication process. As constructed virtual metrology models may account for characterizations and metrology values applicable to preceding steps in the semiconductor fabrication process, the virtual cross metrology technology of the present disclosure may increase the accuracy by which such virtual metrology models predict wafer characteristics. And by encoding design information, the virtual cross metrology technology described herein can allow construction of virtual metrology models that can predict wafer characteristics across multiple circuit designs. Accordingly, the virtual cross metrology technology of the present disclosure can provide an elegant and coherent framework to support design-specific process optimization and improve the quality of virtual metrology predictions.

Figure 5:
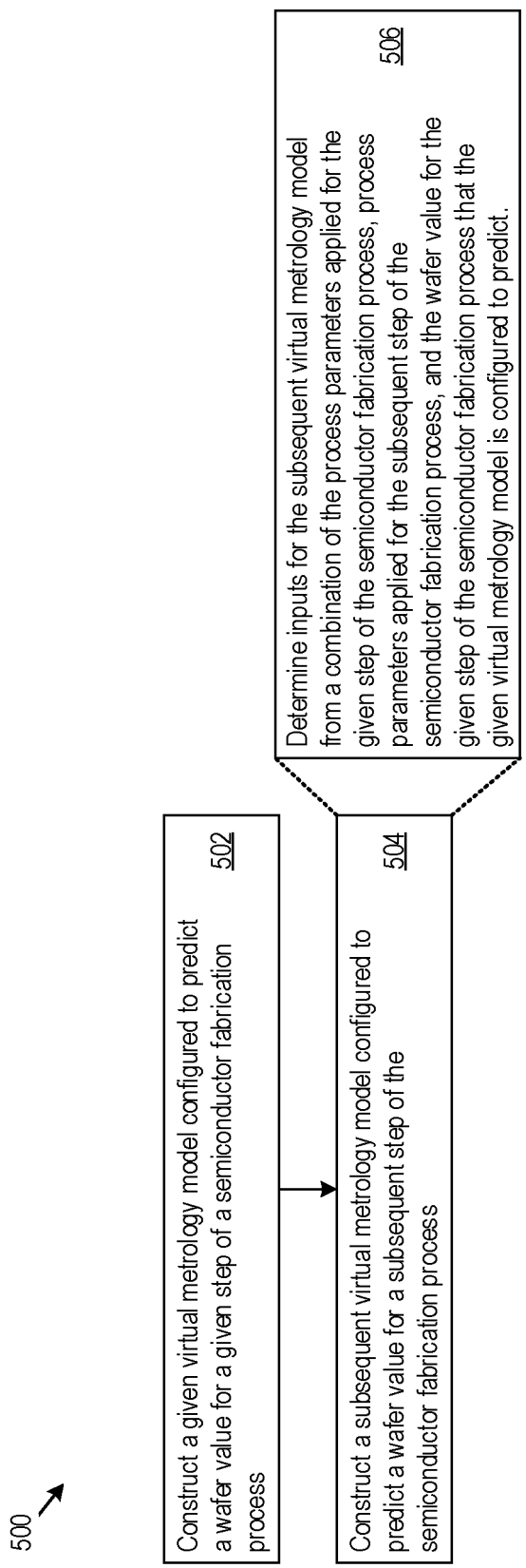
FIG. 5 shows an example of logic that a computing system may implement to support virtual cross metrology-based modeling of semiconductor fabrication processes.

FIG. 5 shows an example of logic 500 that a system may implement to support virtual cross metrology-based modeling of semiconductor fabrication processes. For example, the computing system 100 may implement the logic 500 as hardware, executable instructions stored on a machine-readable medium, or as a combination of both. The computing system 100 may implement the logic 500 via the virtual cross metrology engine 110, through which the computing system 100 may perform or execute the logic 500 as a method. The following description of the logic 500 is provided using the virtual cross metrology engine 110 as an example. However, other implementation options by computing systems are possible.

In implementing the logic 500, the virtual cross metrology engine 110 may construct a given virtual metrology model configured to predict a wafer value for a given step of a semiconductor fabrication process (502), and the given virtual metrology model may take, as inputs, process parameters applied for the given step of the semiconductor fabrication process. In implementing the logic 500, the virtual cross metrology engine 110 may further construct a subsequent virtual metrology model configured to predict a wafer value for a subsequent step of the semiconductor fabrication process (504), and the subsequent step may be performed after the given step in the semiconductor fabrication process. The virtual cross metrology engine 110 may construct the subsequent virtual metrology model by determining inputs for the subsequent virtual metrology model from a combination of the process parameters applied for the given step of the semiconductor fabrication process, process parameters applied for the subsequent step of the semiconductor fabrication process, and the wafer value for the given step of the semiconductor fabrication process that the given virtual metrology model is configured to predict (506).

The logic 500 shown in FIG. 5 provides an illustrative example by which a computing system 100 may support virtual cross metrology-based modeling of semiconductor fabrication processes according to the present disclosure. Additional or alternative steps in the logic 500 are contemplated herein, including according to any of the various features described herein for the virtual cross metrology engine 110.

Figure 6:
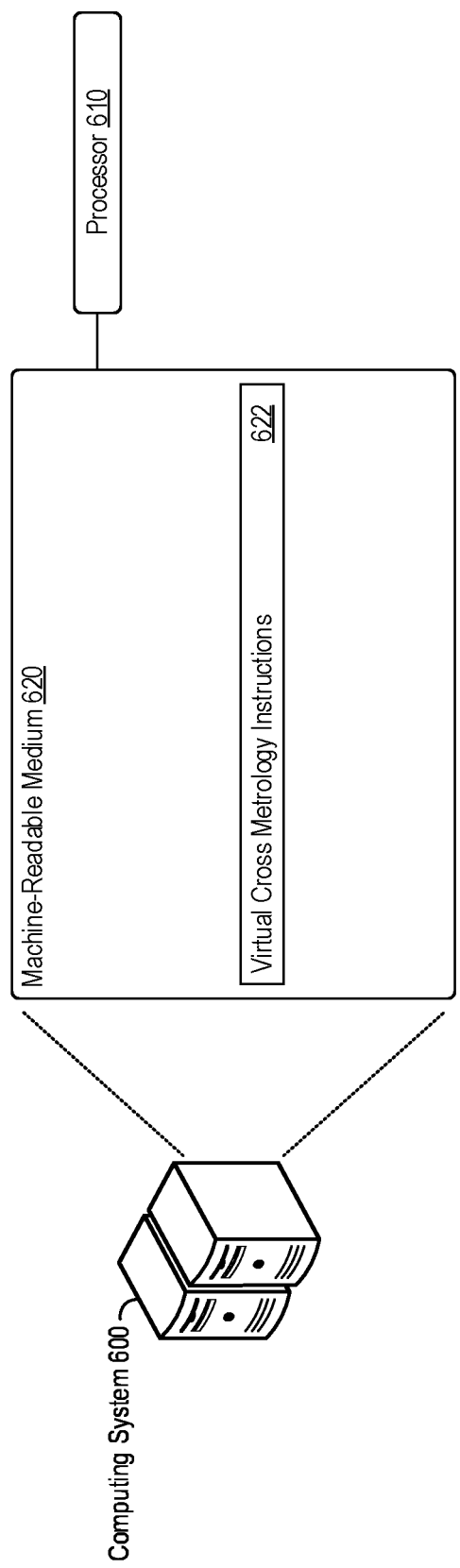
FIG. 6 shows an example of a computing system that supports virtual cross metrology-based modeling of semiconductor fabrication processes.

FIG. 6 shows an example of a computing system 600 that supports virtual cross metrology-based modeling of semiconductor fabrication processes. The computing system 600 may include a processor 610, which may take the form of a single or multiple processors. The processor(s) 610 may include a central processing unit (CPU), microprocessor, or any hardware device suitable for executing instructions stored on a machine-readable medium. The computing system 600 may include a machine-readable medium 620. The machine-readable medium 620 may take the form of any non-transitory electronic, magnetic, optical, or other physical storage device that stores executable instructions, such as the virtual cross metrology instructions 622 shown in FIG. 6. As such, the machine-readable medium 620 may be, for example, Random Access Memory (RAM) such as a dynamic RAM (DRAM), flash memory, spin-transfer torque memory, an Electrically-Erasable Programmable Read-Only Memory (EEPROM), a storage drive, an optical disk, and the like.

The computing system 600 may execute instructions stored on the machine-readable medium 620 through the processor 610. Executing the instructions (e.g., the virtual cross metrology instructions 622) may cause the computing system 600 to perform or implement any of the virtual cross metrology technology described herein, including according to any aspect of the virtual cross metrology engine 110.

For example, execution of the virtual cross metrology instructions 622 by the processor 610 may cause the computing system 600 to construct a given virtual metrology model configured to predict a wafer value for a given step of a semiconductor fabrication process, and the given virtual metrology model may take, as inputs, process parameters applied for the given step of the semiconductor fabrication process. Execution of the virtual cross metrology instructions 622 may further cause the computing system 600 to construct a subsequent virtual metrology model configured to predict a wafer value for a subsequent step of the semiconductor fabrication process, and the subsequent step may be performed after the given step in the semiconductor fabrication process. Execution of the virtual cross metrology instructions 622 may cause the computing system 600 to construct the subsequent virtual metrology model by determining inputs for the subsequent virtual metrology model from a combination of the process parameters applied for the given step of the semiconductor fabrication process, process parameters applied for the subsequent step of the semiconductor fabrication process, and the wafer value for the given step of the semiconductor fabrication process that the given virtual metrology model is configured to predict.

Any additional or alternative aspects of the virtual cross metrology technology as described herein may be implemented via the virtual cross metrology instructions 622.

The systems, methods, devices, and logic described above, including the virtual cross metrology engine 110, may be implemented in many different ways in many different combinations of hardware, logic, circuitry, and executable instructions stored on a machine-readable medium. For example, the virtual cross metrology engine 110 may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. A product, such as a computer program product, may include a storage medium and machine-readable instructions stored on the medium, which when executed in an endpoint, computer system, or other device, cause the device to perform operations according to any of the description above, including according to any features of the virtual cross metrology engine 110.

The processing capability of the systems, devices, and engines described herein, including the virtual cross metrology engine 110, may be distributed among multiple system components, such as among multiple processors and memories, optionally including multiple distributed processing systems or cloud/network elements. Parameters, databases, and other data structures may be separately stored and managed, may be incorporated into a single memory or database, may be logically and physically organized in many different ways, and may be implemented in many ways, including data structures such as linked lists, hash tables, or implicit storage mechanisms. Programs may be parts (e.g., subroutines) of a single program, separate programs, distributed across several memories and processors, or implemented in many different ways, such as in a library (e.g., a shared library).

While various examples have been described above, many more implementations are possible.

The invention claimed is:

1. A method comprising:
by a computing system:
constructing a given virtual metrology model configured to predict a wafer value for a given step of a semiconductor fabrication process, wherein the given virtual metrology model takes, as inputs, process parameters applied for the given step of a semiconductor fabrication process;
constructing a subsequent virtual metrology model configured to predict a wafer value for a subsequent step of the semiconductor fabrication process, wherein the subsequent step is performed after the given step in the semiconductor fabrication process, and wherein constructing the subsequent virtual metrology model comprises determining inputs for the subsequent virtual metrology model from a combination of:
the process parameters applied for the given step of the semiconductor fabrication process;
process parameters applied for the subsequent step of the semiconductor fabrication process; and
the wafer value for the given step of the semiconductor fabrication process that the given virtual metrology model is configured to predict,
wherein determining the inputs for the subsequent virtual metrology model comprises determining a selected subset of the process parameters applied for the given step of the semiconductor fabrication process, the process parameters applied for the subsequent step of the semiconductor fabrication process, and the wafer value for the given step of the semiconductor fabrication process that the given virtual metrology model is configured to predict to use as the inputs for the subsequent virtual metrology model, and
wherein determining the selected subset comprises:
performing a value analysis process on the process parameters applied for the given step of the semiconductor fabrication process, the process parameters applied for the subsequent step of the semiconductor fabrication process, and the wafer value for the given step of the semiconductor fabrication process that the given virtual metrology model is configured to predict in order to determine impact contributions to the wafer value predicted by the subsequent virtual metrology model for the subsequent step of the semiconductor fabrication process; and
determining the selected subset based on the impact contributions determined through the value analysis process.

2. The method of claim 1, wherein the value analysis process comprises a Shapley value analysis.

3. The method of claim 1, wherein the subsequent step of the semiconductor fabrication process is directly subsequent to the given step of the semiconductor fabrication process.

4. The method of claim 1, wherein constructing the given virtual metrology model for the given step of the semiconductor fabrication process comprises determining inputs for the given virtual metrology model from a combination of:
process parameters applied for a previous step of the semiconductor fabrication process, wherein the previous step is performed prior to the given step in the semiconductor fabrication process;
the process parameters applied for the given step of semiconductor fabrication process; and
a wafer value for the previous step of the semiconductor fabrication process that a previous virtual metrology model is configured to predict.

5. The method of claim 4, wherein constructing the subsequent virtual metrology model comprises determining the inputs for the subsequent virtual metrology model from a combination of:
the process parameters applied for the given step of the semiconductor fabrication process;
the process parameters applied for the subsequent step of the semiconductor fabrication process;
the process parameters applied for the previous step of semiconductor fabrication process;
the wafer value for the given step of the semiconductor fabrication process that the given virtual metrology model is configured to predict; and
the wafer value for the previous step of the semiconductor fabrication process that the previous virtual metrology model is configured to predict.

6. A system comprising:
a virtual cross metrology engine configured to:
construct a given virtual metrology model configured to predict a wafer value for a given step of a semiconductor fabrication process, wherein the given virtual metrology model takes, as inputs, process parameters applied for the given step of the semiconductor fabrication process;
construct a subsequent virtual metrology model configured to predict a wafer value for a subsequent step of the semiconductor fabrication process, wherein the subsequent step is performed after the given step in the semiconductor fabrication process, including by determining inputs for the subsequent virtual metrology model from a combination of:
the process parameters applied for the given step of the semiconductor fabrication process;
process parameters applied for the subsequent step of the semiconductor fabrication process; and
the wafer value for the given step of the semiconductor fabrication process that the given virtual metrology model is configured to predict,
wherein the virtual cross metrology engine is configured to determine the inputs for the subsequent virtual metrology model by determining a selected subset of the process parameters applied for the given step of the semiconductor fabrication process, the process parameters applied for the subsequent step of the semiconductor fabrication process, and the wafer value for the given step of the semiconductor fabrication process that the given virtual metrology model is configured to predict to use as the inputs for the subsequent virtual metrology model, and wherein the virtual cross metrology engine is configured to determine the selected subset by:
performing a value analysis process on the process parameters applied for the given step of the semiconductor fabrication process, the process parameters applied for the subsequent step of the semiconductor fabrication process, and the wafer value for the given step of the semiconductor fabrication process that the given virtual metrology model is configured to predict in order to determine impact contributions to the wafer value predicted by the subsequent virtual metrology model for the subsequent step of the semiconductor fabrication process; and
determining the selected subset based on the impact contributions determined through the value analysis process.

7. The system of claim 6, wherein the value analysis process comprises a Shapley value analysis.

8. The system of claim 6, wherein the subsequent step of the semiconductor fabrication process is directly subsequent to the given step of the semiconductor fabrication process.

9. The system of claim 6, wherein the virtual cross metrology engine is configured to construct the given virtual metrology model for the given step of the semiconductor fabrication process by determining inputs for the given virtual metrology model from a combination of:
process parameters applied for a previous step of the semiconductor fabrication process, wherein the previous step is performed prior to the given step in the semiconductor fabrication process;
the process parameters applied for the given step of semiconductor fabrication process; and
a wafer value for the previous step of the semiconductor fabrication process that a previous virtual metrology model is configured to predict.

10. The system of claim 9, wherein the virtual cross metrology engine is configured to construct the subsequent virtual metrology model by determining the inputs for the subsequent virtual metrology model from a combination of:
the process parameters applied for the given step of the semiconductor fabrication process;
the process parameters applied for the subsequent step of the semiconductor fabrication process;
the process parameters applied for the previous step of semiconductor fabrication process;
the wafer value for the given step of the semiconductor fabrication process that the given virtual metrology model is configured to predict; and
the wafer value for the previous step of the semiconductor fabrication process that the previous virtual metrology model is configured to predict.

11. A non-transitory machine-readable medium comprising instructions that, when executed by a processor, cause a computing system to:
construct a given virtual metrology model configured to predict a wafer value for a given step of a semiconductor fabrication process, wherein the given virtual metrology model takes, as inputs, process parameters applied for the given step of the semiconductor fabrication process;
construct a subsequent virtual metrology model configured to predict a wafer value for a subsequent step of the semiconductor fabrication process, wherein the subsequent step is performed after the given step in the semiconductor fabrication process, and including by determining inputs for the subsequent virtual metrology model from a combination of:
the process parameters applied for the given step of the semiconductor fabrication process;
process parameters applied for the subsequent step of the semiconductor fabrication process; and
the wafer value for the given step of the semiconductor fabrication process that the given virtual metrology model is configured to predict,
wherein the instructions cause the computing system to determine the inputs for the subsequent virtual metrology model by determining a selected subset of the process parameters applied for the given step of the semiconductor fabrication process, the process parameters applied for the subsequent step of the semiconductor fabrication process, and the wafer value for the given step of the semiconductor fabrication process that the given virtual metrology model is configured, and
wherein the instructions cause the computing system to determine the selected subset by:
performing a value analysis process on the process parameters applied for the given step of the semiconductor fabrication process, the process parameters applied for the subsequent step of the semiconductor fabrication process, and the wafer value for the given step of the semiconductor fabrication process that the given virtual metrology model is configured to predict in order to determine impact contributions to the wafer value predicted by the subsequent virtual metrology model for the subsequent step of the semiconductor fabrication process; and
determining the selected subset based on the impact contributions determined through the value analysis process.

12. The non-transitory machine-readable medium of claim 11, wherein the subsequent step of the semiconductor fabrication process is directly subsequent to the given step of the semiconductor fabrication process.

13. The non-transitory machine-readable medium of claim 11, wherein the instructions cause the computing system to construct the given virtual metrology model for the given step of the semiconductor fabrication process by determining inputs for the given virtual metrology model from a combination of:
process parameters applied for a previous step of the semiconductor fabrication process, wherein the previous step is performed prior to the given step in the semiconductor fabrication process;
the process parameters applied for the given step of semiconductor fabrication process; and
a wafer value for the previous step of the semiconductor fabrication process that a previous virtual metrology model is configured to predict.

14. The non-transitory machine-readable medium of claim 13, wherein the instructions cause the computing system to construct the subsequent virtual metrology model by determining the inputs for the subsequent virtual metrology model from a combination of:

the process parameters applied for the given step of the semiconductor fabrication process;
the process parameters applied for the subsequent step of the semiconductor fabrication process;
the process parameters applied for the previous step of semiconductor fabrication process;
the wafer value for the given step of the semiconductor fabrication process that the given virtual metrology model is configured to predict; and
the wafer value for the previous step of the semiconductor fabrication process that the previous virtual metrology model is configured to predict.

* * * * *